(12) United States Patent
Ho et al.

(10) Patent No.: US 6,927,616 B2
(45) Date of Patent: Aug. 9, 2005

(54) INTEGRATED CIRCUIT AND METHOD FOR INTERFACING TWO VOLTAGE DOMAINS USING A TRANSFORMER

(75) Inventors: Shiu Chung Ho, Essex Junction, VT (US); Ivan L. Wemple, Shelburne, VT (US); Stephen D. Wyatt, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,855

(22) Filed: Oct. 31, 2003

(65) Prior Publication Data

US 2005/0093620 A1 May 5, 2005

(51) Int. Cl.[7] .............................................. G06F 1/04
(52) U.S. Cl. ........................ 327/292; 327/333; 327/551
(58) Field of Search ..................... 326/80, 81; 327/291, 327/292, 299, 300, 318, 319, 333, 538, 543, 551

(56) References Cited

U.S. PATENT DOCUMENTS 5,966,297 A * 10/1999 Minegishi .................... 363/24
6,008,681 A * 12/1999 Beutler et al. ............... 327/304
6,087,861 A * 7/2000 Cranford et al. ............. 327/108
6,359,492 B1 * 3/2002 Hipp .......................... 327/333

* cited by examiner

Primary Examiner—Jeffrey Zweizig
(74) Attorney, Agent, or Firm—Downs Rachlin Martin PLLC

(57) ABSTRACT

An integrated circuit designed to reduce on-chip noise coupling. In one embodiment, circuit (60) includes the following: a circuit transformer (62) capable of converting a noise sensitive input reference clock signal to an output signal having a voltage compatible with a predetermined sink voltage logic level; and a biased receiver network (64) having a PFET current mirror (74) coupled with a NFET current (72), the biased receiver transistor network designed to multiply the transformer signal to offset a mutual coupling loss of the transformer. In at least one alternative embodiment, the input reference clock signal originates at an off-chip clock generator circuit (42) and the output signal from receiver (64) is input to a PLL (44). In another alternative embodiment, the transformer is a monolithic integrated transformer. Another alternative embodiment of the present invention is a method of reducing on-chip noise coupling.

16 Claims, 5 Drawing Sheets

INTEGRATED CIRCUIT AND METHOD FOR INTERFACING TWO VOLTAGE DOMAINS USING A TRANSFORMER

BACKGROUND OF INVENTION

1. Field of the Invention

The present invention relates generally to an integrated circuit and method for interfacing two voltage domains using a transformer, and more particularly to an integrated circuit and method for maintaining the integrity of an input reference clock signal in the presence of a noisy chip environment.

2. Background of the Invention

Phase-locked loops (PLLs) are analog circuits that are employed extensively in on-chip clock generation and redistribution systems. PLLs use phase/frequency correction to generate chip clock waveforms that in some way mimic the characteristics of an input reference clock signal. Ideally, the edges of the PLL-generated clock waveform are distributed to be precisely periodic, i.e., the duration of successive clock cycles are constant. Deviation from this ideal behavior is measured using a figure-of-merit called "clock jitter". Excessive clock jitter can be catastrophic and lead to system timing failures.

One of the leading contributors to clock jitter is electrical noise, which can manifest itself as a delay variation in the PLL feedback loop, transient power bus or substrate noise at the PLL itself, or variations in the edge displacement of the (input) reference clock signal.

As illustrated in FIG. 1, in at least one prior art circuit design 20, a reference clock signal (not shown) generated by an off-chip clock generator circuit 21 is passed through an I/O receiver circuit 22, located in a digital region 23 of chip 24. To protect the receiver circuit from electrostatic discharge, or ESD (i.e., static electricity), the receiver circuit input pad 25 is typically tied to an ESD protection circuit 26 that clamps the input voltage to a level below the gate breakdown voltage of the receiver circuit. In common implementations, the input receiver, pad, and ESD circuits share their environment, i.e., power grid wiring, coupled capacitance, etc., with on-chip "noisy" circuits in the digital chip region. This common environment often causes noise 27 to be coupled to the receiver input reference clock signal (not shown) that is passed to a PLL 28 in an analog region 30 of chip 24. As a result, electrical noise 27 in prior art designs may cause excessive clock jitter.

SUMMARY OF INVENTION

One aspect of the present invention is a method of reducing electrical noise coupling to a noise-sensitive chip input signal. The method includes the following steps: providing input circuitry including a noise isolated transformer; converting a noise-sensitive chip input signal to an intermediate signal using the transformer; converting the intermediate signal to a converted signal having a voltage level compatible with that of a predetermined logic level using auxiliary noise-isolated support circuitry; and using the converted signal as input to intended on-chip destination circuitry.

Another aspect of the present invention is an integrated circuit designed to reduce on-chip noise coupling. The integrated circuit includes the following: a circuit transformer capable of converting a noise sensitive input signal to an output signal having a voltage compatible with a predetermined sink voltage logic level; and a biased receiver transistor network having a PFET current mirror coupled with a NFET current mirror. The biased receiver transistor network is designed to multiply the transformer output signal to offset a mutual coupling loss of the transformer.

Still another aspect of the present invention is an integrated circuit designed to reduce on-chip noise coupling. The integrated circuit includes the following: means for converting a noise sensitive input signal to an output signal having a voltage compatible with a predetermined sink voltage logic level; and means for multiplying the transformer output signal to offset a mutual coupling loss of the transformer.

Other features, utilities and advantages of various embodiments of the invention will be apparent from the following more particular description of embodiments of the invention as illustrated in the accompanying drawings.

BRIEF DESCRIPTION OF DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION

Figure 1:
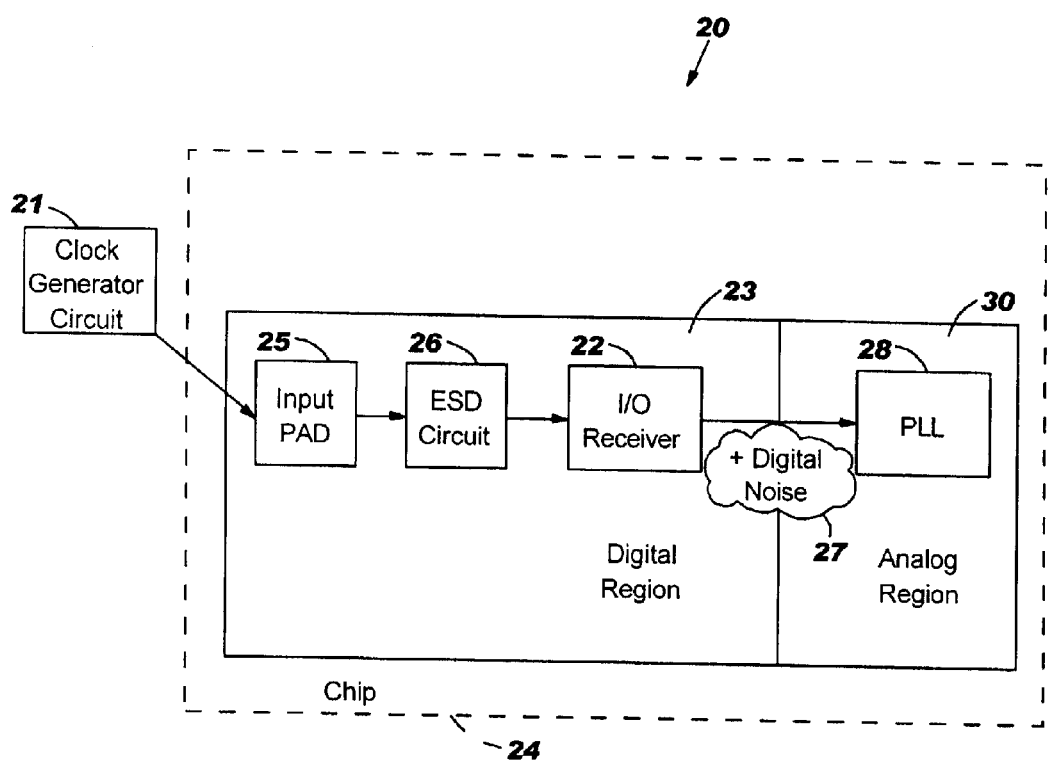
FIG. 1 is a simplified schematic of a prior art circuit including a PLL.
Figure 2:
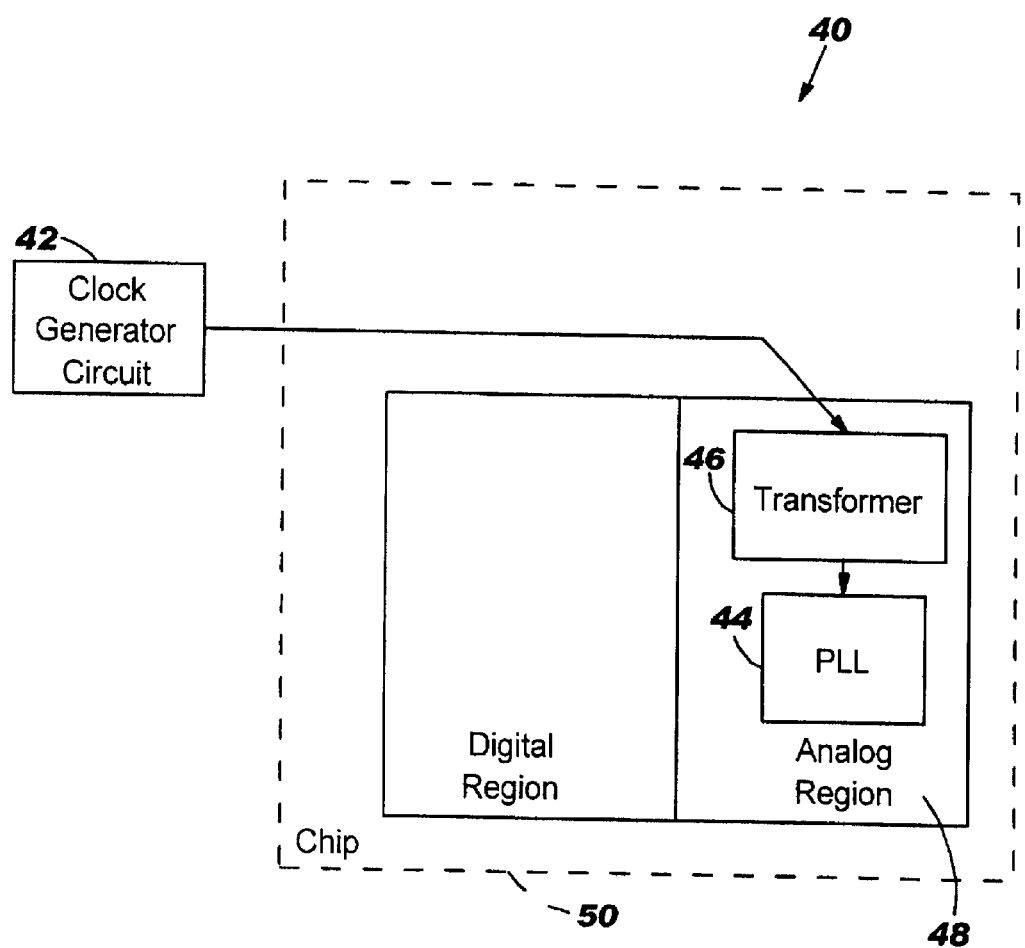
FIG. 2 is a simplified schematic of a circuit including a PLL according to one embodiment of the present invention.
Figure 3:
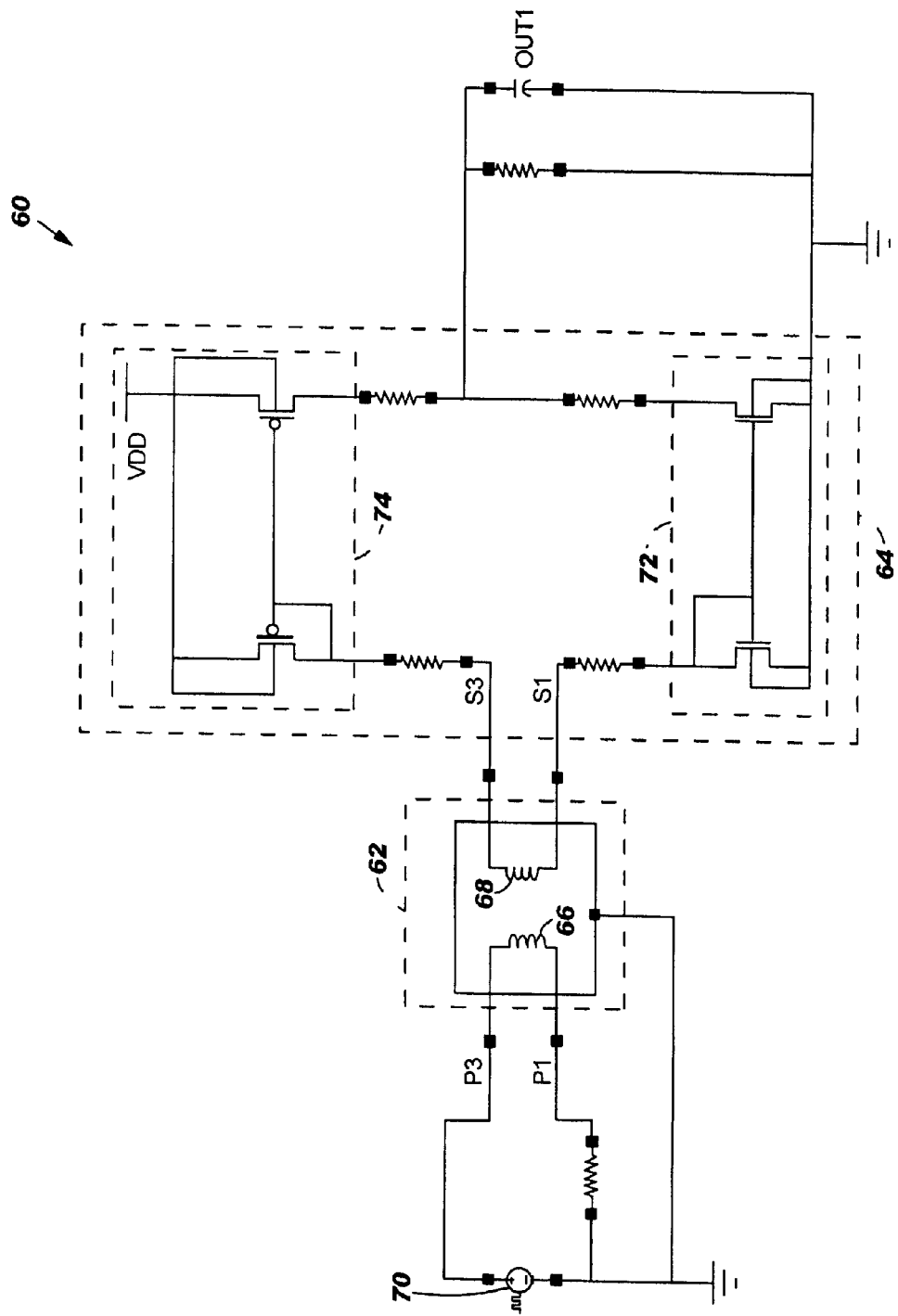
FIG. 3 is a schematic diagram of a transformer and biased receiver circuitry, according to one embodiment of the present invention.

The present invention is directed to an integrated circuit and method for maintaining the integrity of an input reference clock signal in the presence of a noisy chip environment. An example of the disclosed invention is depicted in FIGS. 2 and 3, although it should be understood that the present invention is not limited to this (or any other) particular embodiment, but rather is intended to cover any integrated circuit or method that fairly falls within the broad scope of the appended claims. In the drawings, like elements include like element numbers.

Referring now to the drawings, FIG. 2 illustrates a simplified schematic of a circuit design 40 according to one embodiment of the present invention. An off-chip clock generator circuit 42 supplies a reference clock signal (not shown), which is translated to the input of a PLL 44 via a circuit transformer 46, which provides significant and effective physical isolation between its primary and secondary windings (also not shown). Both PLL 44 and transformer 46 are located in an analog region 48 of a chip 50 and clock generator circuit 42 is located off-chip. In one embodiment, an integrated, i.e., monolithic transformer is used.

Referring now to FIG. 3, circuit design 60 of the present invention includes a transformer 62 and a biased receiver transistor network, referred to as receiver 64 herein. Transformer 62 includes a primary side 66 and a secondary side 68. Primary side 66 of transformer 62 is connected to a reference clock generator 70. Receiver 64 is connected to secondary side 68 of transformer 62. Receiver 64 includes an NFET current mirror 72 and a PFET current mirror 74. The output of receiver circuit 64 is labeled "OUT1". Although in one embodiment circuit design 60 is most effective for the 1 to 2 GHz range, as one skilled in the art will understand, alternate designs within the scope of the invention may be utilized for other frequency ranges of operation.

In operation, when the reference clock generator 70 provides no reference clock signal at the primary coil, i.e., primary side 66, of transformer 62, the transformer secondary coil, i.e., secondary side 68, is simply a wire (i.e., a short circuit) connecting both NFET and PFET current mirrors 72 and 74, respectively. While both NFET current mirror 72 and PFET current mirror 74 are conducting, output OUT1 will typically settle at a voltage level equal to VDD/2, where VDD is the biased receiver network power supply voltage. When the reference clock generator 70 provides a switching signal (not shown), such as a clock or a sine wave at the primary coil, i.e., primary side 66, of transformer 62, an alternating current is driven through the primary coil of the transformer. In this mode of operation, an equivalent current of scaled magnitude will be induced in the secondary coil 68 of transformer 62. The biased receiver circuit mirrors this current modulation to its output, with a fixed multiplication factor. This multiplication factor can be selected to offset the mutual coupling loss associated with the particular transformer used.

Figure 4:
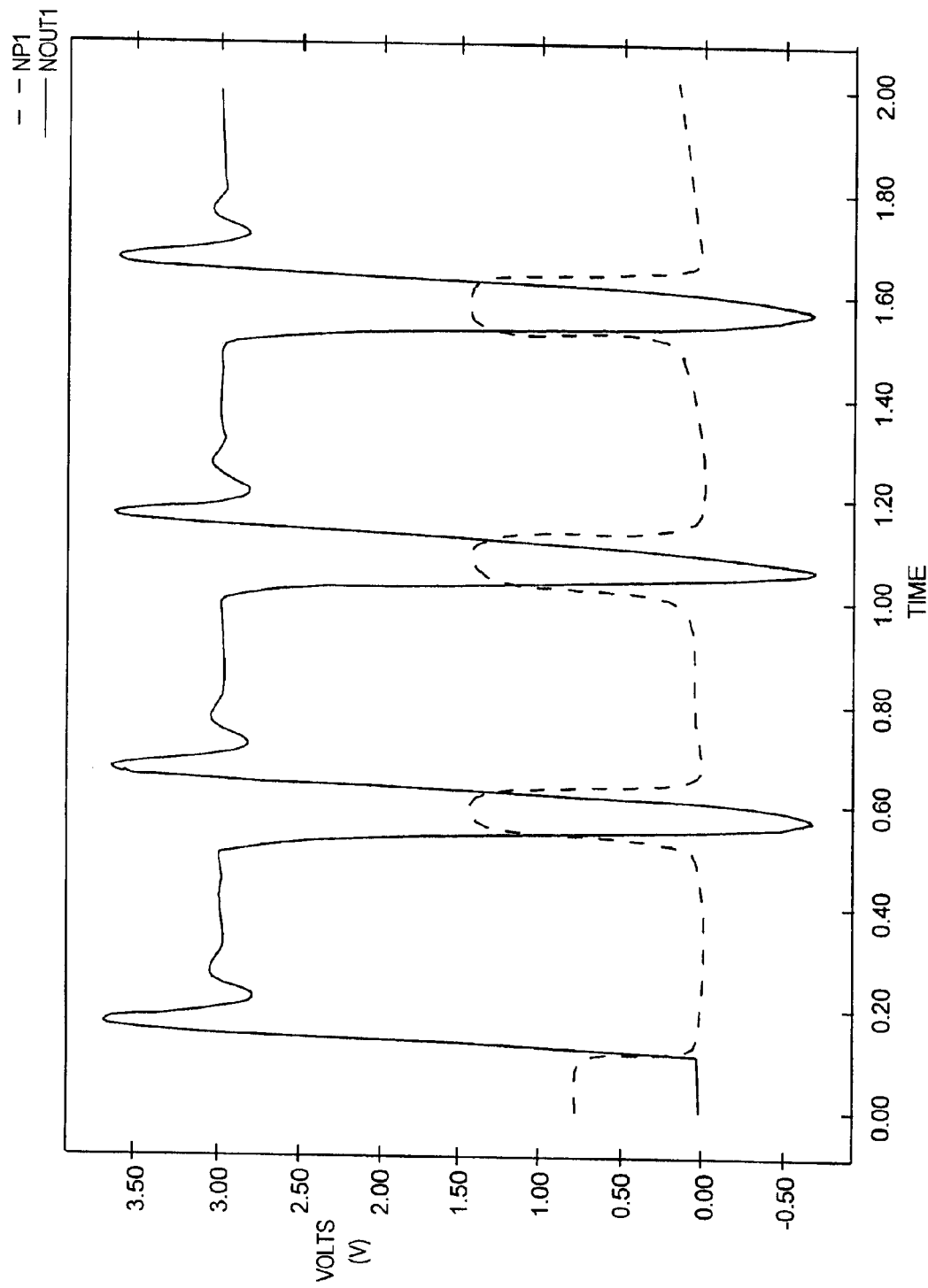
FIG. 4 is a plot of voltage versus time for a simulation of the circuit illustrated in FIG. 3.

Referring now to FIG. 4, a simulation of circuit design 60 with a 3V 2 GHz input switching signal having a 20% to 80% duty cycle, and an output amplitude of 1.5V is illustrated. The input signal waveform is not shown. Signal NP1 is the waveform at the input, i.e., primary side 66, of transformer 62 and signal NOUT1 is the waveform at output OUT1 of receiver 64. The simulation shows that the output signal NOUT1 is successfully level-shifted from 3V to 1.5V, and the duty cycle of the input signal is preserved.

Figure 5:
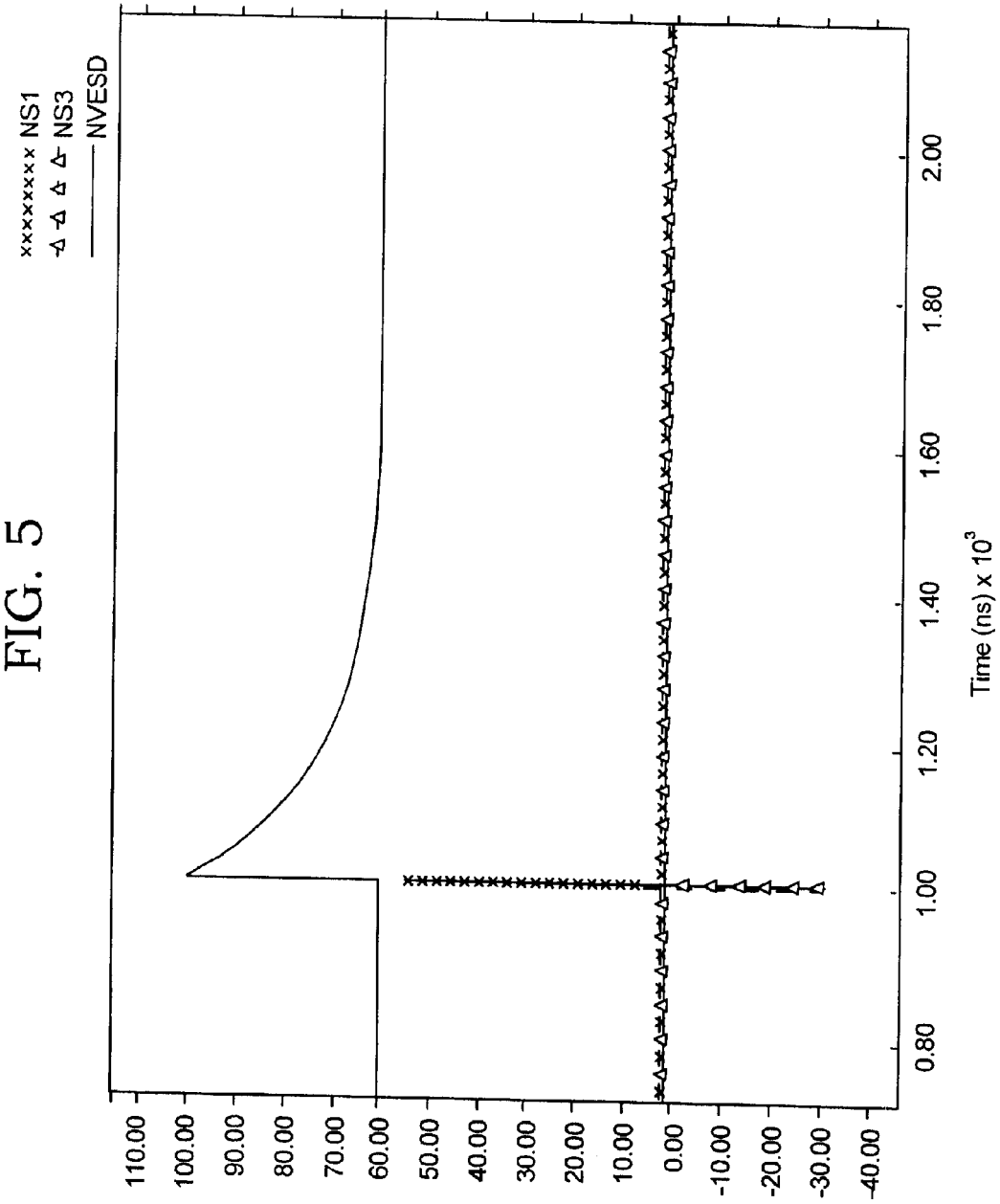
FIG. 5 is a plot of voltage versus time for a simulation of the circuit illustrated in FIG. 3.

In typical integrated circuit designs, each chip input pad is normally tied to a device structure that clamps the input voltage to a level below the gate-oxide breakdown voltage of the receiver. In embodiments of the present invention, the transformer physically decouples the input pad from thin device oxides and, therefore, less stringent, if any, ESD protection is required to maintain circuit reliability. FIG. 5 illustrates simulation results obtained from injecting an ESD-induced transient voltage onto primary side 66 of transformer 62 in circuit design 60. Specifically, a "human-body model" (typical transient voltage "spikes" generated by the human body are in the range of 2–4 kV) was applied to discharge 4 kV onto the primary side 66 of transformer 62. Signal NVESD is the 4 kV voltage transient (at 1/100th scale with a fixed DC offset for better illustration), and signals NS1 and NS3 are the waveforms at the transformer "outputs", i.e. on the secondary side 68 of transformer 62. The obtained result demonstrates a peak voltage swing of approximately 55 volts across the transformer secondary winding, which would directly impose a 55-volt transient on thin-oxide devices in the chip analog region (48 of FIG. 2). While this level does exceed typical device breakdown voltages, the ESD protection required for an event of this magnitude would require far less chip area than ESD circuits normally integrated at input receiver chip pads. In fact, the total chip area requirement for transformer 62 with adequate ESD protection is approximately equal to that of an input receiver circuit and its pad ESD structure in a typical ASIC library. Consequently, the transformer-based input scheme described here imposes no overall area penalty when compared to the conventional approach.

The circuit designs according to the present invention minimize noise coupling and related clock jitter by eliminating the use of an external and noisy input receiver circuit. A potentially noise-sensitive chip input signal is transferred directly to a transformer and noise-isolated supporting circuitry, where it is then delivered directly to its intended circuitry. The present invention circuit and method may be utilized to provide noise immunity for any signal being delivered from off-chip.

While the present invention has been described in connection with specified embodiments, it will be understood that it is not so limited. On the contrary, it is intended to cover all alternatives, modifications and equivalents as may be included within the spirit and scope of the invention as defined in the appended claims.

What is claimed is:

1. An integrated circuit designed to reduce on-chip noise coupling, the integrated circuit comprising:
   a circuit transformer capable of converting a noise sensitive input signal to an output signal having a voltage compatible with a predetermined sink voltage logic level; and
   a biased receiver transistor network having a PFET current mirror coupled with a NFET current mirror, said biased receiver transistor network designed to multiply said transformer output signal to offset a mutual coupling loss of said transformer.

2. An integrated circuit according to claim 1, wherein said input signal originates in a first voltage domain and said output signal from said biased receiver transistor network is output to a second voltage domain, said second voltage domain being noncontiguous with said first voltage domain.

3. An integrated circuit according to claim 1, wherein said input signal originates at an off-chip signal source and is output to an on-chip signal sink included in on-chip analog circuitry.

4. An integrated circuit according to claim 3, wherein said off-chip signal source is a reference clock.

5. An integrated circuit according to claim 1, wherein said output signal from said biased receiver transistor network is input to a PLL.

6. An integrated circuit according to claim 1, wherein said transformer is a monolithic integrated transformer.

7. A method of reducing electrical noise coupling to a noise-sensitive chip input signal, comprising the steps of:
   providing input circuitry including a noise isolated monolithic integrated transformer;
   converting a noise-sensitive chip input signal to an intermediate signal using said transformer;
   converting said intermediate signal to a converted signal having a voltage level compatible with that of a predetermined logic level using auxiliary noise-isolated support circuitry; and
   using said converted signal as input to intended on-chip destination circuitry.

8. A method according to claim 7, wherein said step of converting the transformed signal is performed using a biased receiver transistor network having a PFET current mirror coupled with a NFET current mirror.

9. A method according to claim 7, wherein said input signal in said step of converting a noise-sensitive chip input signal originates at an off-chip signal source and is output to an on-chip signal sink included in on-chip analog circuitry.

10. A method according to claim 9, wherein said off-chip signal source is a reference clock.

11. The method according to claim 7, further comprising the step of:

multiplying said transformer output signal to offset a mutual coupling loss of said transformer.

12. A method according to claim 11, wherein said converted signal in said multiplying step is input to a PLL.

13. An integrated circuit designed to reduce on-chip noise coupling, the integrated circuit comprising:

a monolithic integrated circuit transformer for converting a noise sensitive input signal to an output signal having a voltage compatible with a predetermined sink voltage logic level; and means for multiplying said transformer output signal to offset a mutual coupling loss of said transformer.

14. An integrated circuit according to claim 13, wherein said means for multiplying is a biased receiver transistor network having a PFET current mirror coupled with a NFET current mirror.

15. An integrated circuit according to claim 13, wherein said input signal originates in a first voltage domain and said output signal from said biased receiver transistor network is output to a second voltage domain, said second voltage domain being noncontiguous with said first voltage domain.

16. An integrated circuit according to claim 13, wherein said input signal from said biased receiver transistor network is input to a PLL.

\* \* \* \* \*